United States Patent
Chang et al.

(10) Patent No.: US 8,431,239 B2
(45) Date of Patent: Apr. 30, 2013

(54) ARTICLE AND METHOD FOR MANUFACTURING SAME

(75) Inventors: Hsin-Pei Chang, Tu-Cheng (TW); Wen-Rong Chen, Tu-Cheng (TW); Huan-Wu Chiang, Tu-Cheng (TW); Cheng-Shi Chen, Tu-Cheng (TW); Chuang Ma, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 189 days.

(21) Appl. No.: 12/968,424

(22) Filed: Dec. 15, 2010

(65) Prior Publication Data

US 2012/0021210 A1    Jan. 26, 2012

(30) Foreign Application Priority Data

Jul. 23, 2010    (CN) .......................... 2010 1 0235428

(51) Int. Cl.
*B32B 7/02*    (2006.01)
*C23C 14/06*    (2006.01)
*C23C 14/35*    (2006.01)

(52) U.S. Cl.
USPC .......... 428/666; 428/336; 428/332; 428/702; 428/632; 428/663

(58) Field of Classification Search ....................... None
See application file for complete search history.

(56) References Cited

U.S. PATENT DOCUMENTS

| | | | |
|---|---|---|---|
| 5,527,647 A * | 6/1996 | Doi et al. | 430/5 |
| 7,255,806 B2 * | 8/2007 | Yoshimura et al. | 216/65 |
| 7,303,658 B2 * | 12/2007 | Sugiyama et al. | 204/192.27 |
| 7,485,238 B2 * | 2/2009 | Satoh et al. | 216/41 |
| 2006/0172138 A1 * | 8/2006 | Stachowiak | 428/432 |
| 2009/0051860 A1 * | 2/2009 | Hiruma et al. | 349/106 |
| 2009/0279101 A1 * | 11/2009 | Kalkowski et al. | 356/512 |

FOREIGN PATENT DOCUMENTS

JP    2007241136 A  *  9/2007

* cited by examiner

*Primary Examiner* — Vera Katz
(74) *Attorney, Agent, or Firm* — Altis Law Group, Inc.

(57) ABSTRACT

A article made by vacuum deposition, includes a substrate; and a color layer deposited on the substrate, wherein the color layer has an L* value between about 75 to about 80, an a* value between about −5 to about −10, and a b* value between about 15 to about 20 in the CIE LAB color space.

4 Claims, 2 Drawing Sheets

ARTICLE AND METHOD FOR MANUFACTURING SAME

BACKGROUND

1. Technical Field

The exemplary disclosure generally relates to articles and methods for manufacturing the articles.

2. Description of Related Art

Vacuum deposition is used to form a thin film or coating on housings of portable electronic devices, to improve the abrasion resistance. However, typical vacuum deposition only can deposit black or gold coatings on the housing so the housing has limited appearance compared to other processes used, such as anodic treatment.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary embodiment of an article and method for manufacturing the article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
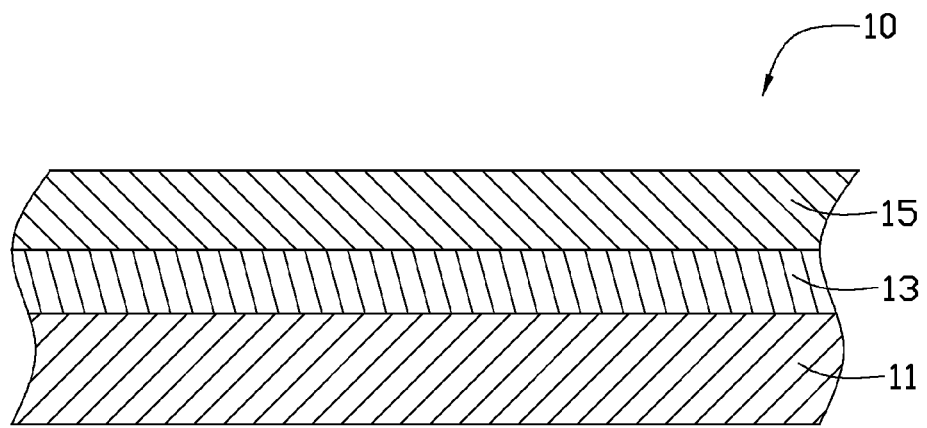
FIG. 1 illustrates a cross-sectional view of an exemplary embodiment of an article.
Figure 2:
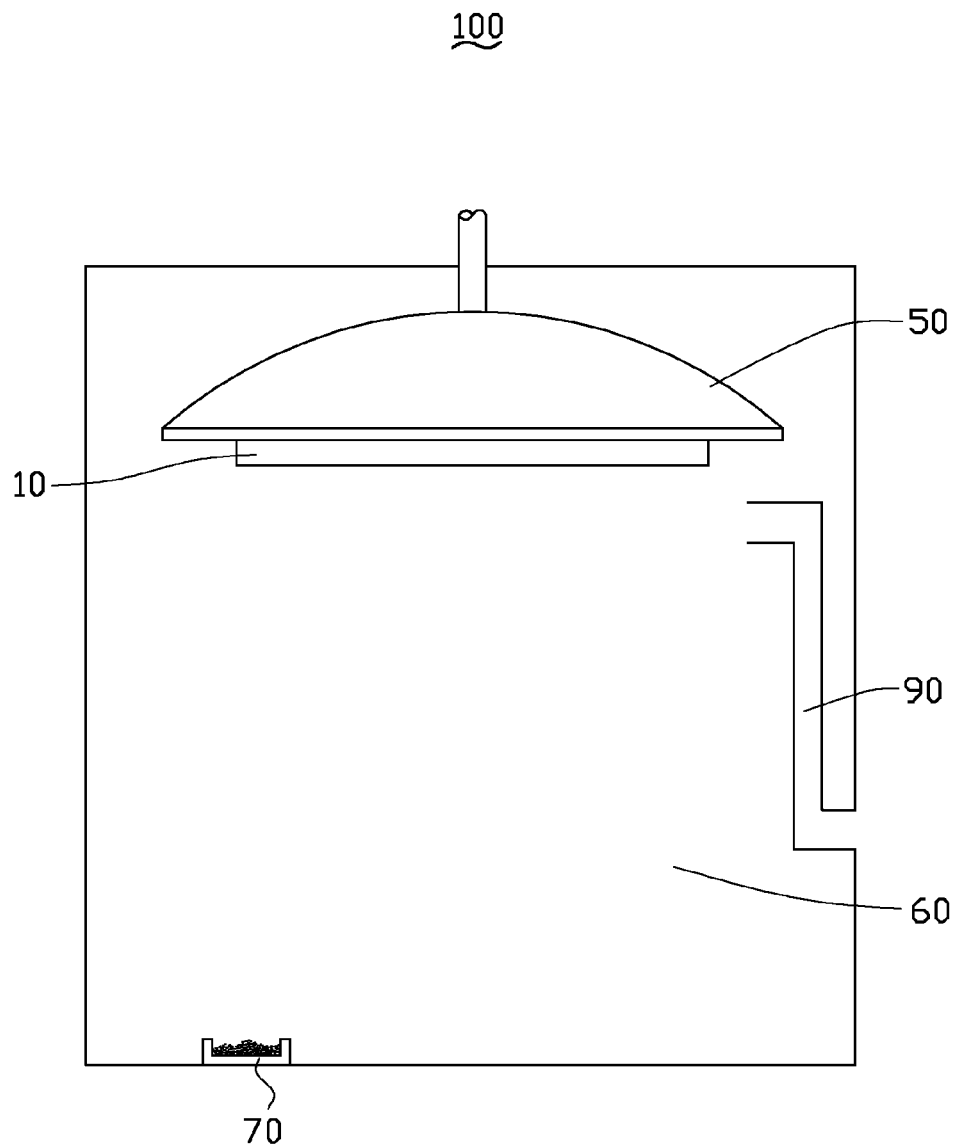
FIG. 2 is a schematic view of a magnetron sputtering coating machine for manufacturing the article in FIG. 1.

Referring to FIG. 1, an exemplary embodiment of an article 10 manufactured, by coating process, such as by vacuum deposition, includes a substrate 11, a bonding layer 13 deposited on the substrate 11 and a color layer 15 deposited on the bonding layer 13 opposite to the substrate 11. The article 10 may be a housing of electronic device. The substrate 11 is made of metal, glass, plastic or ceramic.

The bonding layer 13 is formed between the substrate 11 and the color layer 15 for improving the binding force between the substrate 11 and the color layer 15. The bonding layer 13 may be comprised of chromium. The bonding layer 13 has a thickness ranging from about 0.01 micrometer to about 0.1 micrometer, and in this embodiment has a thickness of 0.05 micrometer. The bonding layer 13 in this embodiment has a color that does not affect the color of the color layer 15, such as silver, white, or gray.

The color layer 15 is a chromium oxide layer. In this exemplary embodiment, the color layer 15 may be made of Chromium (II) oxide (CrO). The color layer 15 is green which has an L* value between about 75 to about 80, an a* value between about −5 to about −10, and a b* value between about 15 to about 20 in the CIE L*a*b* (CIE LAB) color space, so the color layer 15 is substantially green. The color layer 15 has a thickness ranging from about 0.5 micrometer to about 3 micrometer. In this embodiment, it has a thickness of about 2 micrometer.

A method for manufacturing the article 10 manufactured by vacuum deposition may include at least the following steps.

A substrate 11 is provided. The substrate 11 may be made of metal, glass, plastic or ceramic.

The substrate 11 is pretreated. For example, the substrate 11 may be washed with a solution (e.g., alcohol or Acetone) in an ultrasonic cleaner, to remove, e.g., grease, dirt, and/or impurities. The substrate 11 is then dried. The substrate 11 may also be cleaned by an argon plasma cleaning. The substrate 11 is retained on a rotating bracket 50 in a vacuum chamber 60 of a magnetron sputtering coating machine 100. The vacuum level of the vacuum chamber 60 is adjusted to $8.0 \times 10-3$ Pa. Pure argon is floated into the vacuum chamber 60 at a flux of about 300 sccm (Standard Cubic Centimeters per Minute) to 600 sccm; a bias voltage applied to the substrate 11 in a range from −300 to −800 volts for a time of about 5 to about 15 min. So the substrate 11 is washed by argon plasma, to further remove the grease or dirt. Thus, a binding force between the substrate 11 and the color layer 15 is enhanced.

The bonding layer 13 is deposited on the substrate 11 by magnetron sputtering. The temperature in the vacuum chamber 60 is adjusted to 120~180° C., i.e., the reaction temperature is about 120- about 180° C.; the argon is floated into the vacuum chamber 60 at a flux from about 100 sccm to about 500 sccm, i.e. The reaction gas of depositing the bonding layer 13 is argon. The speed of the rotating bracket 50 is adjusted to 2 to 3 rpm (revolution per minute). A chromium target 70 is evaporated and a bias voltage applied to the substrate 11 in a range from about −100 to about −500 volts for a time of about 5 min to about 15 min, to deposit the bonding layer 13 on the substrate 11.

The color layer 15 is deposited on the bonding layer 13 by magnetron sputtering. The temperature in the vacuum chamber 60 is kept from about 120° C. to about 180° C., i.e., the reaction temperature is about 120- about 180° C.; the argon is continuously floated into the vacuum chamber 60 at a flux from about 100 sccm to about 500 sccm and oxygen is floated into the vacuum at a flux from 5 sccm to 100 sccm, i.e., the reaction gas of depositing the color layer 15 is argon and oxygen; the speed of the rotating bracket 50 is kept from about 2 to about 3 revolution per minute (rpm); the chromium target 70 is continuously evaporated; a bias voltage applied to the substrate 11 is in a range from about −100 to about −300 volts for a time of about 20 min to about 60 min, to deposit the color layer 15 on the bonding layer.

The color layer 15 is green which has an L* value between 75 to 80, an a* value between about −5 to about −10, and a b* value between about 15 to about 20 in the CIE L*a*b* (CIE LAB) color space, and the color layer 15 is substantially green.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An article, comprising:
   a substrate;
   a bonding layer formed on the substrate, the bonding layer being a chromium layer consisting of chromium; and
   a color layer directly deposited on the bonding layer, the color layer is a chromium oxide layer, wherein the color layer has a L* value between 75 to 80, an a* value between −5 to −10, and a b* value between 15 to 20 in the CIE LAB color space, and the color layer is substantially green, the color layer has a thickness ranging from about 0.5 micrometer to about 3 micrometer.

2. The article as claimed in claim 1, wherein the color layer is made of Chromium(II) oxide.

3. The article as claimed in claim 1, wherein the bonding layer has a thickness ranging from about 0.01 micrometer to about 0.1 micrometer.

4. The article as claimed in claim 1, wherein the substrate is made of metal, glass, plastic or ceramic.

* * * * *